United States Patent [19]
Nath

[11] Patent Number: 5,273,608
[45] Date of Patent: Dec. 28, 1993

[54] METHOD OF ENCAPSULATING A PHOTOVOLTAIC DEVICE

[75] Inventor: Prem Nath, Rochester Hills, Mich.

[73] Assignee: United Solar Systems Corporation, Troy, Mich.

[21] Appl. No.: 833,619

[22] Filed: Feb. 6, 1992

Related U.S. Application Data

[63] Continuation of Ser. No. 619,482, Nov. 29, 1990.

[51] Int. Cl.$^5$ ............... B32B 31/08; B32B 31/10; H01L 75/00
[52] U.S. Cl. ............... 156/301; 136/245; 136/251; 156/192; 156/302; 156/324; 437/2
[58] Field of Search ........ 156/301, 300, 299, 302, 156/324, 192, 306.6, 164; 136/251, 245; 437/2

[56] References Cited

U.S. PATENT DOCUMENTS

| | | | |
|---|---|---|---|
| 3,441,463 | 4/1969 | Buck | 156/301 |
| 3,767,500 | 10/1973 | Tally et al. | 156/324 |
| 3,780,424 | 12/1973 | Forestieri et al. | 437/2 |
| 3,957,537 | 5/1976 | Baskett et al. | 437/2 |
| 4,149,655 | 4/1979 | Costogue | 136/245 |
| 4,219,926 | 9/1980 | Bloch | 136/245 |
| 4,382,833 | 5/1983 | Coyle et al. | 156/382 |
| 4,419,530 | 12/1983 | Nath | 437/2 |
| 4,499,658 | 2/1985 | Lewis | 437/2 |
| 4,773,944 | 9/1988 | Nath et al. | 437/2 |
| 4,888,061 | 12/1989 | Wenz | 437/2 |
| 5,057,163 | 10/1991 | Barnett | 136/258 P C |

FOREIGN PATENT DOCUMENTS

| | | | |
|---|---|---|---|
| 56-69874 | 6/1981 | Japan | 136/251 |
| 2042802 | 9/1980 | United Kingdom | 136/251 |

OTHER PUBLICATIONS

SOVONICS TM Solar Systems, "Sovonics Power Series: Building Blocks for Solar Electric Generators" Sep. 1987.

"Improvements in Silicon Solar Cell Cover Glass Assembly and Packaging Using FEP Teflon", Forestieri et al., Aug. 1970.

*Primary Examiner*—Michael W. Ball
*Assistant Examiner*—Daniel J. Stemmer
*Attorney, Agent, or Firm*—Krass & Young

[57] ABSTRACT

A flexible encapsulated photovoltaic device is prepared by disposing photovoltaic devices on a sheet of thermoplastic material, disposing a front encapsulant material atop the devices, and disposing a bottom encapsulant layer so as to provide a multi-layered structure. The multi-layered structure is rolled under tension so as to compress the layers and the roll is heated to activate the thermoplastic material and bond the layers together. Additional layers may be interposed prior to rolling.

21 Claims, 2 Drawing Sheets

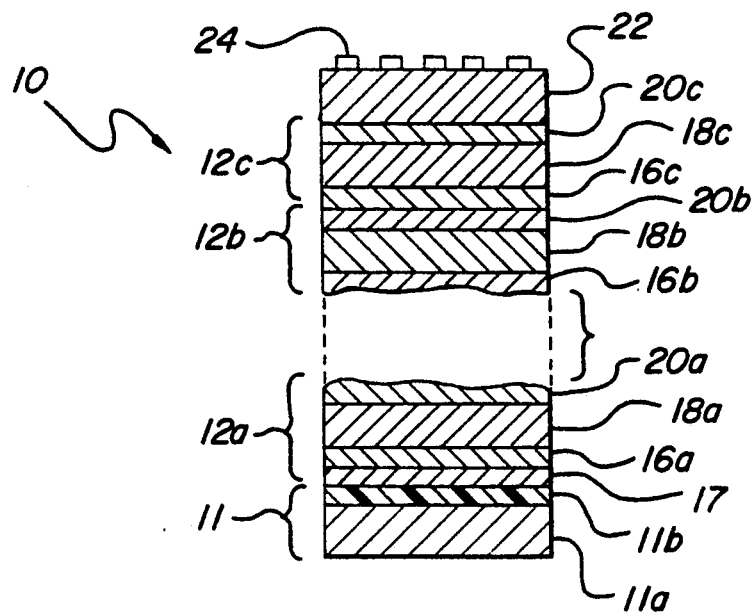
FIG-1
FIG-2
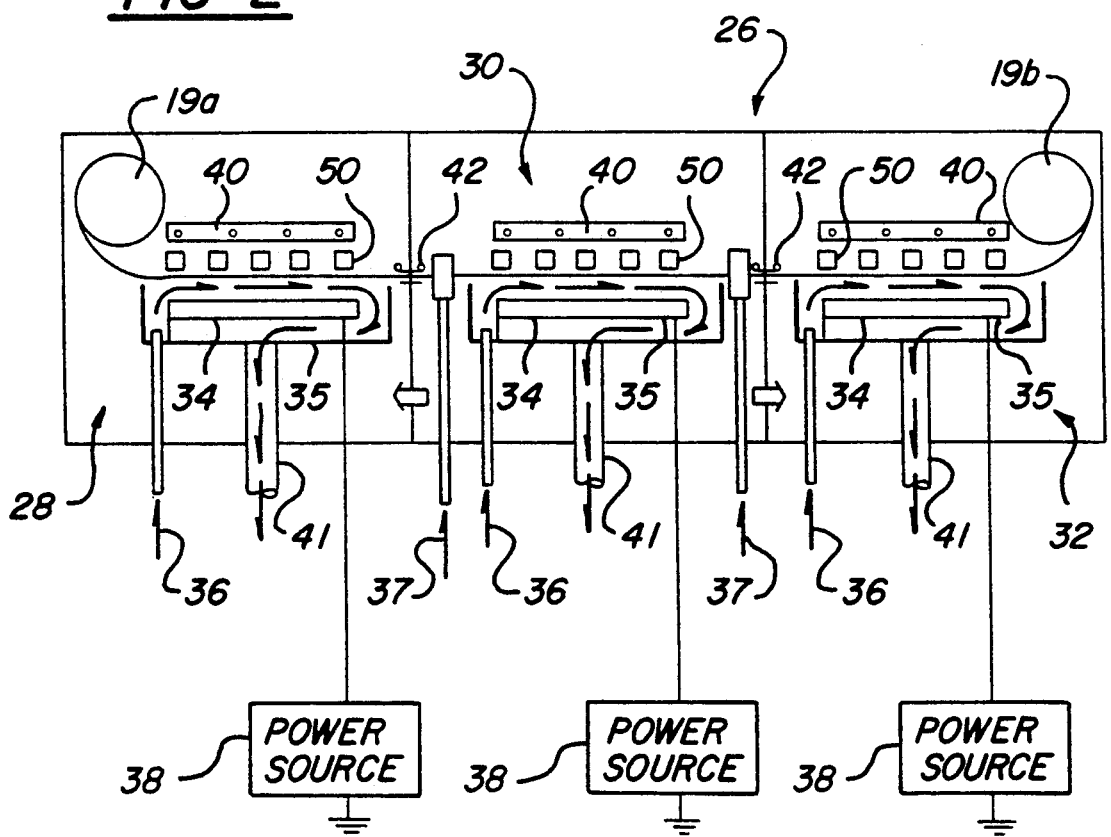

METHOD OF ENCAPSULATING A PHOTOVOLTAIC DEVICE

This is a continuation of co-pending application Ser. No. 619,482 filed on Nov. 29, 1990, now abandoned.

FIELD OF THE INVENTION

This invention relates generally to photovoltaic devices. More specifically, the invention relates to photovoltaic devices encapsulated by at least one protective layer. Most specifically, the invention relates to a method for laminating thin film photovoltaic devices with a flexible protective sheet.

BACKGROUND OF THE INVENTION

Because of the growing cost, scarcity and hazards associated with the use of fossil and nuclear fuels, increasing use is being made of photovoltaic energy sources. Photovoltaic cells are reliable, silent in operation, and neither consume natural resources nor emit polluting byproducts during operation. Initially, photovoltaic power sources were restricted to single crystal devices. These cells were expensive, fragile and bulky; hence, their uses were limited to highly specialized applications.

More recently, thin film electronic devices, including photovoltaic devices, have been developed which are equivalent, or superior, to single crystalline devices in operation. Thin film photovoltaic devices are rugged, reliable, inexpensive and efficient. U.S. Pat. Nos. 4,226,898 and 4,217,374 of Ovshinsky et al detail techniques for the manufacture of high quality thin film semiconductor materials and devices. Further, techniques have been developed for the large scale, continuous deposition of high quality, thin film photovoltaic devices over relatively large area substrates. Such techniques are disclosed, for example, in U.S. Pat. No. 4,485,125.

Thin film photovoltaic devices may be fabricated from a variety of materials including silicon alloys, germanium alloys, cadmium telluride, copper indium diselinide and other such materials. These devices are thin and flexible and may be readily cut to a variety of sizes and shapes. Thin film photovoltaic devices may be interconnected in a variety of configurations to provide appropriate voltage and power outputs for particular applications. In general, thin film photovoltaic devices are encapsulated between protective layers prior to use, in order to protect them from mechanical damage or ambient atmospheric conditions. Additionally, thin film photovoltaic devices are frequently laminated to relatively rigid support members for particular applications. For example, photovoltaic roofing panels are manufactured by laminating a thin film photovoltaic device to sheets of aluminum, galvanized steel or other such roofing material.

In general, the photovoltaic device is laminated between a protective, transparent top coat and a supporting substrate by means of a layer of thermoplastic polymer or the like and the lamination process is carried out by a vacuum lamination process. Typically, the device is sandwiched between encapsulating layers and a flexible, air impermeable membrane is placed over the device. Air is evacuated from beneath the membrane and the pressure of the atmosphere, acting through the membrane, compresses the device. The device is heated while under compression to complete the lamination.

While the results of such lamination are generally adequate, the lamination process represents a significant expenditure of capital resources and the lamination equipment occupies large areas of valuable floor space in a manufacturing environment. Additionally, particular skill in operation of the lamination equipment is necessary.

U.S. patent application Ser. No. 590,775, now abandoned, discloses a process for preparing a substrate for electronic devices, which substrate comprises a metallic support having a layer of electrically insulating, polymeric material laminated thereto. According to the method disclosed therein, the metallic substrate and the insulating polymeric material are interwound to form a tightly wound roll which is then heated. The heat bonds the insulating material to the metal, thereby creating a composite substrate.

The present invention is directed to a process whereby an interleaved assemblage of photovoltaic cells and flexible encapsulating materials is rolled together and laminated with or without an evacuation step. The method of the present invention is simple and inexpensive and may be readily integrated with techniques for the continuous production of large area photovoltaic devices. These and other advantages of the present invention will be readily apparent from the drawings, discussion and description which follow.

BRIEF DESCRIPTION OF THE INVENTION

There is disclosed herein a method for manufacturing an encapsulated photovoltaic device. The method includes the steps of providing a photovoltaic device, providing a first roll of adhesive material, unwinding a portion of the adhesive roll and disposing the photovoltaic devices on the unwound portion of the roll. In further steps, a roll of back encapsulant material is provided and unwound as is a roll of front encapsulant material. The photovoltaic device, adhesive material and encapsulant materials are interleaved so as to provide a layered structure comprising, in order, front encapsulant material, photovoltaic device, first adhesive material, and back encapsulant material. The layered structure is rolled up under tension so as to provide a tightly wound composite roll of said layered structure. In the final step, the roll is heated for a period of time sufficient to activate the adhesive material.

In a further embodiment of the invention, a second roll of adhesive material is provided and interleaved between the front encapsulant material and photovoltaic device prior to winding. In yet other embodiments, the front encapsulant material may be precoated with an adhesive material. In yet other embodiments, further layers of materials such as a dielectric material may also be interleaved into the structure prior to rolling.

Heating may be accomplished in an oven. The adhesive generally comprises a thermally activated cross-linking adhesive such as an ethylene vinyl acetate polymer or a hot melt adhesive. The photovoltaic devices may comprise discrete cells or they may comprise a module of interconnected cells.

BRIEF DESCRIPTION OF THE DRAWINGS

FIG. 1 is a fragmentary cross-sectional view of a thin film tandem photovoltaic device comprising a plurality of p-i-n type cells of the type which may be employed in connection with the instant invention;

FIG. 2 is a diagrammatic representation of a multiple glow discharge chamber deposition system adapted for the continuous production of photovoltaic devices of the type shown in FIG. 1;

DETAILED DESCRIPTION OF THE DRAWINGS

I. The Photovoltaic Cell

Figure 3:
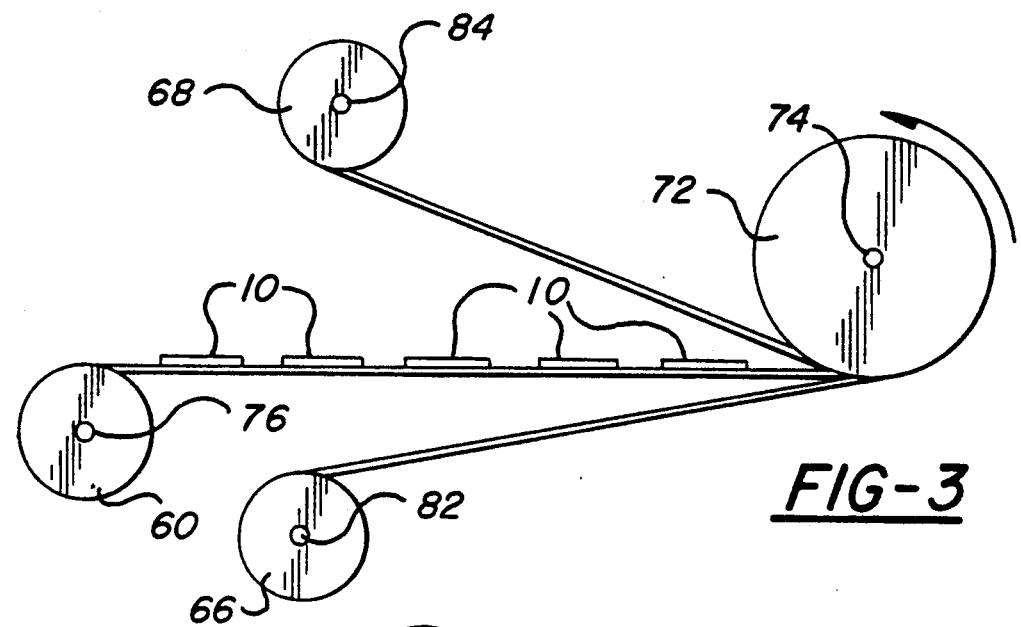
FIG. 3 is a schematic illustration of one embodiment of photovoltaic device lamination process implemented in accord with the present invention.

Referring now to the drawings and particularly to FIG. 1, a photovoltaic cell, formed of a plurality of successive p-i-n layers, each of which includes, in the preferred embodiment, an amorphous semiconductor alloy, is shown generally by the numeral 10. While the present invention may be utilized for the encapsulation of a variety of photovoltaic devices; the thin film, large area, flexible photovoltaic devices of FIG. 1 are particularly well suited for use in the present invention.

More particularly, FIG. 1 shows a p-i-n type photovoltaic device such as a solar cell made up of individual p-i-n type cells 12a, 12b and 12c. Below the lower most cell 12a is a composite substrate 11 consisting of a relatively thick support layer 11a and a flexible, relatively thin insulating layer 11b; and it is to be understood that the substrate may also comprise a unitary body of electrically conductive material such as stainless steel.

An electrically conductive bottom, electrical contact layer 17 is operatively disposed atop the insulating layer 11b so as to be in electrical communication with the semiconductor cells 12a, 12b, 12c formed thereatop. In those instances where the substrate is a single, electrically conductive member, the contact layer 17 may be eliminated. It is to be noted at this point that, in some cases, it is desirable to include a specular or diffuse back reflector layer as part of the substrate 11 of the photovoltaic cell 10. This back reflector layer if specular, may be the bottom contact 17, or, if diffuse, is disposed immediately beneath or above the bottom contact 17, so that it functions to scatter and redirect light passing through the active regions of the photovoltaic cell.

Each of the cells 12a, 12b and 12c are fabricated with an amorphous semiconductor body containing at least a silicon or germanium alloy. Each of the semiconductor bodies includes an n-type conductivity layer 20a, 20b and 20c; an intrinsic layer 18a, 18b and 18c; and a p-type conductivity layer 16a, 16b and 16c. As illustrated, cell 12b is an intermediate cell and, as indicated in FIG. 1, additional intermediate cells may be stacked atop cells. Also, although p-i-n cells are illustrated, n-i-p cells may be similarly employed. The present invention may also be used in the encapsulation of any type of thin film electronic device in either a continuous or batch mode of production.

It is to be understood that following the deposition of the semiconductor layers, a further deposition process may be either performed in a separate environment or as part of a continuous process. In this step, TCO (transparent conductive oxide) layer 22 is added. This layer functions as the upper electrode, and cooperates with the bottom contact layer 17 to establish a current path through the device 10. An electrode grid 24 may be added to the device where the cell is of a sufficiently large area, or if the conductivity of the TCO layer 22 is insufficient. The grid 24 shortens the carrier path through the TCO and thus increases the conduction efficiency.

II. The Multiple Glow Discharge Deposition Chamber Apparatus

Turning now to FIG. 2, a diagrammatic representation of a multiple glow discharge chamber deposition apparatus for the continuous production of photovoltaic cells is generally illustrated by the reference numeral 26. The apparatus 26 includes a plurality of isolated, dedicated deposition chambers, each chamber of which is interconnected by a gas gate through which sweep gases and a web of substrate material 11 are adapted to pass.

The apparatus 26 is adapted to mass produce, in the preferred embodiment, large area, amorphous semiconductor cells having a p-i-n type configuration on the surface of a substrate material 11 which is continually fed therethrough. To deposit the amorphous semiconductor layers required for producing multiple p-i-n type layer cells, the apparatus 26 includes at least one triad of deposition chambers. Each triad of deposition chambers comprises: a first deposition chamber 28 in which a p-type conductivity semiconductor layer is deposited onto the deposition surface of the substrate 11 as the substrate 11 passes therethrough; a second deposition chamber 30 in which an intrinsic amorphous semiconductor layer is deposited atop the p-type alloy layer on the deposition surface of the substrate 11 as the substrate 11 passes therethrough; and a third deposition chamber 32 in which an n-type conductivity semiconductor layer is deposited atop the intrinsic layer on the deposition surface of the substrate 11 as the substrate 11 passes therethrough. It should be apparent that, (1) although only one triad of the deposition chambers has been illustrated, additional triads or additional individual chambers may be added to the apparatus to provide the machine with the capability of producing semiconductor cells having any number of p-i-n type semiconductor layers; (2) the substrate supply core 19a and the substrate take-up core 19b are shown as disposed in the deposition chambers for illustrative purposes only, while in reality the cores would be housed in separate chambers operatively connected to the deposition chambers; and (3) although the glow discharge technique illustrated herein employs cathodes energized by r.f. power, other glow discharge techniques such as the use of microwave frequencies, may be employed.

Each deposition chamber 28, 30 and 32 of the triad is adapted to deposit a single semiconductor layer, by glow discharge deposition onto the substrate 11. To that end, each of the deposition chambers 28, 30 and 32 includes: a cathode 34; a shield 35 disposed about each of the cathodes 34; a process gas supply conduit 36 for introducing process gas mixtures into the area adjacent the cathodes; a power source 38 such as an alternating current generator; an evacuation conduit 41 for removing unused or spent process gases and nondeposited plasma components; a plurality of transversely extending magnetic elements 50; a plurality of radiant heating elements shown schematically as 40; and a gas gate 42 operatively connecting the intrinsic deposition chamber to each of the dopant chambers. Further, inert sweep gas conduits 37 are disposed on opposed sides of the intrinsic deposition chamber 30 for establishing a unidirectional flow of inert gas through the gas gates 42. Although the gas gates 42 are depicted as establishing a unidirectional flow of inert gas, the gas gates 52 may also have other types of internal flow of sweep gas established as long as the flow operates to prevent diffusion of process gas between the adjacent deposition chambers.

The supply conduits 36 are operatively associated with the respective cathodes 34 to deliver process gas mixtures to the plasma regions which are created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The alternating current generators 38 operate in conjunction with the cathodes 34, the radiant heaters 40 and the grounded substrate 11 to form the plasma, and disassociate the process gases entering the plasma region of the deposition chambers into deposition species. The deposition species are then deposited onto the bottom surface of the substrate 11 as amorphous semiconductor layers. The substrate 11 may be maintained substantially flat by the plurality of rows of magnetic elements 50 which provide an attractive force urging the substrate upwardly, out of its normal sagging path of travel.

To form the photovoltaic cell 10 illustrated in FIG. 1, a p-type semiconductor layer is deposited onto the substrate 11 in the deposition chamber 28, an intrinsic amorphous semiconductor layer is deposited atop the p-type layer in the deposition chamber 30, and an n-type semiconductor layer is deposited atop the intrinsic layer in the deposition chamber 32. As a result, the apparatus 26 deposits at least three successive semiconductor layers onto the substrate 11, wherein the intrinsic layer deposited in deposition chamber 30 differs in composition from the layers deposited in deposition chambers 28 and 3 by the absence of at least one element which will be referring to as the dopant or doping species.

In use, photovoltaic devices such as that illustrated in FIG. 1 are encapsulated in a polymeric protective material and are usually laminated to a support sheet. Lamination and encapsulation provide protection from damage by moisture or other ambient species. The present invention provides a simple and quick process for laminating photovoltaic, and other thin film semiconductor, devices which does not require any specialized tooling or materials.

III. The Method of Encapsulating the Photovoltaic Device

Figure 4:
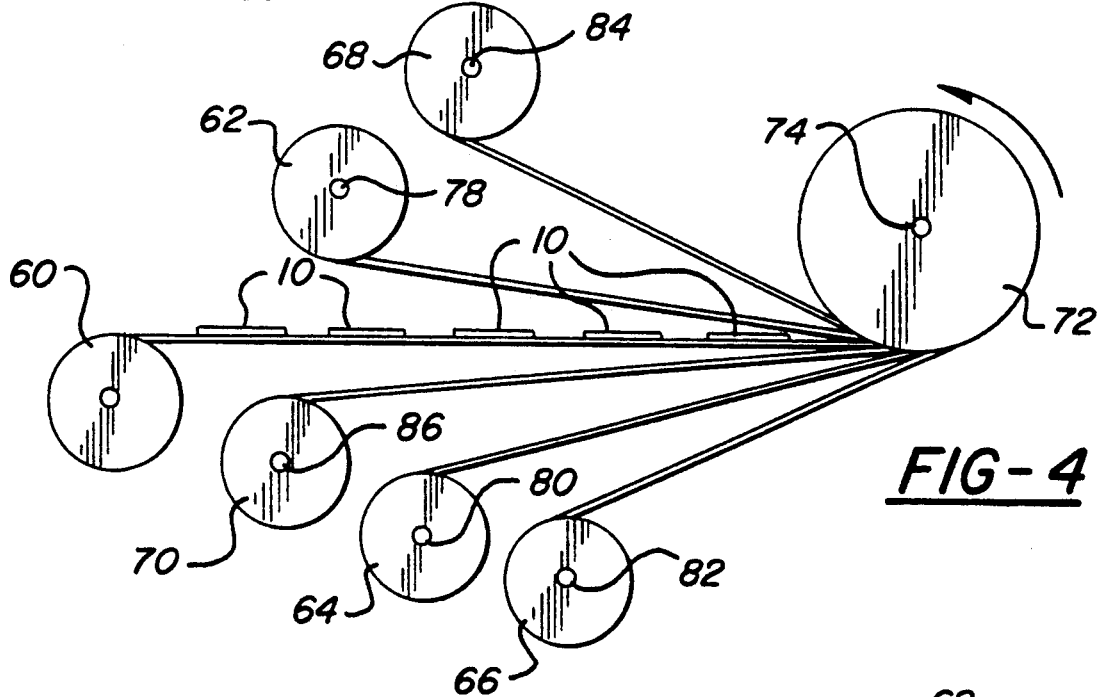
FIG. 4 is a schematic illustration of a second embodiment of photovoltaic device lamination process implemented in accord with the present invention.

The process steps for encapsulating the photovoltaic device 10 are schematically illustrated in FIGS. 3 and 4. As shown in FIG. 3, an elongated sheet of a first adhesive material 60 is provided in roll form wound around a roller 76 and the photovoltaic device 10 is disposed along an unrolled portion of the first adhesive material 60. The adhesive is a heat-activatable adhesive such as a hot-melt adhesive, cross-linking adhesive or a thermally activated epoxy or urethane adhesive. The photovoltaic devices may comprise discrete devices, or may comprise a plurality of devices electrically interconnected in a series and/or parallel electrical relationship. An elongated sheet of back encapsulant material 66 and an elongated sheet of front encapsulant material 68 are also provided in roll form wound around rollers 82 and 84, respectively, and a portion of each is unrolled. (It should be noted that while the encapsulant and adhesive materials are preferably provided in roll form, in secondary, albeit equally preferred embodiments, they may be provided in sheet form without departing from the spirit or scope of the instant invention.)

The materials so provided are interleaved and simultaneously wound together onto a common take-up roller 74 to create a composite, layered structure 72 comprising, in order, front encapsulant material 68, photovoltaic device 10, first adhesive material 60, and back encapsulant material 66. Tension of at least 200 lbs. is maintained on the rolls of back encapsulant material 66, front encapsulant material 68, and the first adhesive material 60 while the composite structure 72 is being wound onto the common take-up roller 74 so that the resultant roll of composite structure 72 that encapsulates the photovoltaic device 10 is tightly wound and free from air pockets or air bubbles. The level of tension is maintained by adjusting the drag on the rotating pay-out rollers 76, 82, and 84 and the speed of the common take-up roller 74, around which the composite structure 72 is wound, in a manner well known in the art.

Once all the layers of material have been interleaved and wound together, the entire composite layered structure 72 is heated for a period of time sufficient to activate the adhesive material so as to laminate the photovoltaic device 10, between the encapsulant layers 66,68. Typically, a heat source, such as a conventional box oven (not shown) is provided. The heat source need only be of a size sufficient to contain the composite layered structure 72 and maintain a temperature of at least 120° C. In order to activate the heat sealing properties of the hot-melt adhesive, the composite structure 72 remains in the box oven for a period of approximately 10 to 30 minutes. Of course, the temperature can be reduced if the tension or the time is increased or the temperature and time can be increased if the tension is reduced. In other words, the skilled artisan can manipulate pressure, time, and temperature parameters in order to optimize the bond between the encapsulating layers 66 and 68, the first adhesive layer 60, and the photovoltaic device 10. It should be noted that in some instances, it may be desirable to subject the rolled structure to a low pressure treatment either before, or during, the heating step. This treatment removes any trapped air.

The photovoltaic device 10 may be provided in the form of a single, continuous solar panel, or as a plurality of interconnected solar subcells as shown in FIGS. 3 and 4. The roll of front encapsulant material 68 is, in the preferred embodiment, a transparent, synthetic, organic polymeric material. For example, a transparent fluorocarbon polymer may be used. The back encapsulant material 66 may be either a synthetic polymeric material, or a metal such as galvanized steel or aluminum. The first adhesive material 60 is a thermally activated adhesive. In the preferred embodiment, the first adhesive material 60 is ethylene vinyl acetate (EVA).

As is illustrated in FIG. 4, additional layers may be added to further protect the photovoltaic device 10 and facilitate the encapsulating process. For example, an elongated sheet of second adhesive material 62 may be provided in roll form wound around a roller 78. A portion of the second adhesive material 62 may be unwound and interleaved between the front encapsulant material 68 and the photovoltaic device 10 to assist in bonding. Furthermore, an elongated sheet of dielectric material 70 may also be provided in roll form wound around a roller 86 such that a portion of the dielectric material 70 may be unwound and layered in between the first adhesive material 60 and the back encapsulant material 66. The dielectric layer is preferably included when the rear encapsulant is electrically conductive. Nylon mesh is one preferred dielectric material. If it is so desired, an elongated sheet of a third adhesive material 64 may also be provided in roll form wound around a roller 80 to bond the dielectric material 70 to the back encapsulant material 66. The second and third adhesive materials 62 and 64 are also thermally activated adhesives such as ethylene vinyl acetate (EVA).

Optionally, the front encapsulant material 68 may be pretreated with the second adhesive material 62 before layering it into the composite structure 72 to encapsulate the photovoltaic device 10. Likewise, the dielectric material 70 may be pretreated with the third adhesive material 64 prior to layering and rolling the dielectric material 70 into the composite layered structure 72 to encapsulate the photovoltaic device 10. In keeping with the spirit of the present invention, still other layers may be similarly interposed.

Figure 5:
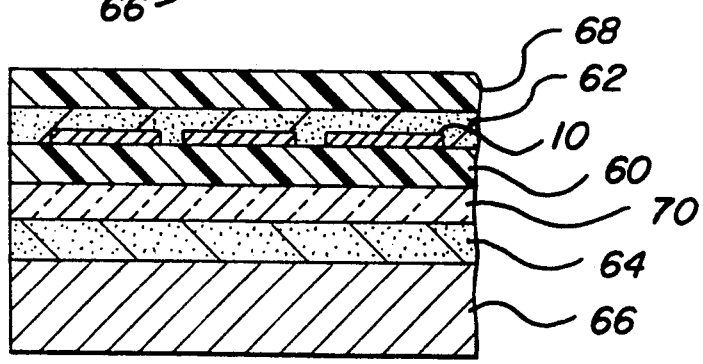
FIG. 5 is a cross-sectional view of an encapsulated photovoltaic device according to the present invention.

FIG. 5 illustrates a cross sectional view of the composite layered structure 72 that encapsulates the photovoltaic device 10 after the heating process has been completed. The composite structure 72 in FIG. 5 illustrates a front encapsulant material 68 and a second adhesive material 62 atop the photovoltaic cells 10 which are positioned on the first adhesive material 60. The first adhesive material 60 upon which the photovoltaic cells 10 sit is supported by dielectric material 70, a layer of third adhesive material 64 and finally a back encapsulant layer 66. The back encapsulant 66 shown in FIG. 5 is galvanized steel.

The foregoing descriptions and drawings are directed to particular embodiments which are illustrative of the principles of the instant invention, and are not intended to be limitations thereupon. It is the following claims, including all equivalents, which are intended to define the scope of the invention.

I claim:

1. A method of manufacturing an encapsulated flexible photovoltaic device, said method including the steps of:

providing a flexible, thin film photovoltaic device;
providing a first roll of adhesive material;
unwinding a portion of said first adhesive roll, while maintaining said first roll under tension;
disposing said photovoltaic device on said unwound portion of the tensioned first adhesive roll, such that said portion supports said device;
providing a roll of flexible back encapsulant material;
unwinding a portion of said flexible back encapsulant material roll, while maintaining said back encapsulant roll under tension;
providing a roll of front encapsulant material;
unwinding a portion of said front encapsulant material roll, while maintaining said front encapsulant roll under tension;
interleaving said materials so as to provide a layered structure comprising, in order, front encapsulant material, photovoltaic device, first adhesive material, and back encapsulant material;
rolling up said layered structure while maintaining tension on said rolls of materials so as to flex said photovoltaic device and to provide a tightly wound composite roll of said layered structure; and
heating said roll of layered structure for a period of time sufficient to activate said adhesive material.

2. The method of claim 1 including the further steps of:

providing a second roll of adhesive material;
unwinding a portion of said second roll of adhesive material while maintaining said second roll under tension; and
interleaving said materials so as to provide a layered structure comprising, in order, front encapsulant material, second adhesive material, photovoltaic device, first adhesive material, and back encapsulant material.

3. The method of claim 1 wherein the step of providing a roll of front encapsulant material includes providing a roll of front encapsulant material pretreated with second adhesive material.

4. The method of claim 2 including the further steps of:

providing a roll of dielectric material;
unwinding a portion of said roll of dielectric material while maintaining said dielectric roll under tension; and
interleaving said roll of dielectric material into the layered structure between the first adhesive material and the back encapsulant material.

5. The method of claim 4 including the further steps of:

providing a third roll of adhesive material;
unwinding a portion of said third roll of adhesive material while maintaining said third roll under tension; and
interleaving said roll of third adhesive material between the dielectric material and the back encapsulant material.

6. The method of claim 4 wherein the step of providing a roll of dielectric material includes providing a roll of dielectric material pretreated with a third adhesive material.

7. The method of claim wherein the step of providing a flexible, thin film photovoltaic device comprises providing a single, continuous solar panel.

8. The method of claim 1 wherein the step of providing a flexible, thin film photovoltaic device comprises providing a plurality of interconnected subcells.

9. The method of claim 1 wherein the step of providing the first roll of adhesive material comprises providing a first roll of thermoplastic, hot-melt adhesive.

10. The method of claim 9, wherein the step of providing a first roll of thermoplastic hot-melt adhesive comprises providing a first roll of ethylene vinyl acetate polymer.

11. The method of claim 1 wherein the step of providing a roll of back encapsulant material comprises providing a roll of synthetic polymeric material.

12. The method of claim 1 wherein the step of providing a roll of back encapsulant material comprises providing a roll of a non-rigid metal.

13. The method of claim 12 wherein the step of providing a roll of a metal comprises providing a roll of galvanized steel.

14. The method of claim 12 wherein the step of providing a roll of a metal comprises providing a roll of aluminum.

15. The method of claim 1 wherein the step of providing a roll of front encapsulant material comprises providing a roll of a transparent, synthetic, organic polymeric material.

16. The method of claim 15 wherein the step of providing a roll of a transparent, synthetic, organic polymeric material comprises providing a roll of a transparent fluorocarbon polymer.

17. The method of claim 1 wherein the step of heating said roll of layered structure comprises disposing said roll in an oven.

18. The method of claim 17, including the further step of maintaining the oven at a temperature of at least 120° C.

19. The method of claim 1 including the further step of exposing the roll of layered structure to the source of heat for a time period of between 10 to 30 minutes.

20. The method of claim 1 including the further step of maintaining the rolls at a tension of at least 200 pounds while rolling up said layered structure.

21. A method of manufacturing an encapsulated photovoltaic device, said method including the steps of:
providing a flexible, thin film photovoltaic device;
providing a first roll of adhesive material;
unwinding a portion of said first adhesive roll while maintaining said first roll under tension;
disposing said photovoltaic device on said unwound portion such that said portion supports said device;
providing a roll of flexible back encapsulant material;
unwinding a portion of said roll of back encapsulant material while maintaining said back encapsulated roll under tension;
providing a second roll of adhesive material;
unwinding a portion of said second roll of adhesive material while maintaining said second roll under tension;
providing a roll of flexible front encapsulant material;
unwinding a portion of said roll of front encapsulant material while maintaining said front encapsulant roll under tension;
interleaving said materials so as to provide a layered structure comprising, in order, front encapsulant material, second adhesive material, photovoltaic device, first adhesive material, and back encapsulant material;
rolling up said layered structure while maintaining tension on said rolls of material so as to flex said photovoltaic device and to provide a tightly wound roll of said layered structure; and
heating said roll of layered structure for a period of time sufficient to activate said adhesive materials.

* * * * *